(12) United States Patent
Hlotyak

(10) Patent No.: US 7,254,508 B2
(45) Date of Patent: Aug. 7, 2007

(54) SITE LOOPS

(75) Inventor: Stephen J. Hlotyak, Belmont, MA (US)

(73) Assignee: Teradyne, Inc., North Reading, MA (US)

( * ) Notice: Subject to any disclaimer, the term of this patent is extended or adjusted under 35 U.S.C. 154(b) by 4 days.

(21) Appl. No.: 11/231,722

(22) Filed: Sep. 20, 2005

(65) Prior Publication Data

US 2006/0247879 A1 Nov. 2, 2006

Related U.S. Application Data

(60) Provisional application No. 60/676,737, filed on May 2, 2005, provisional application No. 60/676,005, filed on Apr. 29, 2005, provisional application No. 60/676,003, filed on Apr. 29, 2005.

(51) Int. Cl.
*G06F 17/00* (2006.01)
(52) U.S. Cl. ............ 702/108; 702/109; 702/110; 702/111; 702/112; 702/113; 702/114; 702/115; 702/116; 702/117; 702/118; 702/119; 702/120; 702/121; 702/122; 702/123
(58) Field of Classification Search ........ 702/108, 702/109–123; 324/750, 755, 763
See application file for complete search history.

(56) References Cited

U.S. PATENT DOCUMENTS

| | | | |
|---|---|---|---|
| 5,845,234 A | 12/1998 | Testa et al. | |
| 6,941,232 B2 | 9/2005 | Burke et al. | |
| 2004/0225465 A1 | 11/2004 | Pramanick et al. | |
| 2005/0154551 A1* | 7/2005 | Pramanick et al. | 702/119 |
| 2005/0261856 A1 | 11/2005 | Kushnick et al. | |

OTHER PUBLICATIONS

International Search Report for Application No. PCT/US06/13546, dated Apr. 12, 2006.
Written Opinion for Application No. PCT/US06/13546, dated Apr. 12, 2006.

* cited by examiner

*Primary Examiner*—Hal Wachsman
*Assistant Examiner*—Phuong Huynh
(74) *Attorney, Agent, or Firm*—Fish & Richardson P.C.

(57) ABSTRACT

A method for use with a test system having sites that hold devices under test (DUTs) includes executing a first site loop to iterate through the sites, where the first site loop includes an instruction to program hardware associated with at least one of the sites, and executing a second site loop to process data received from the DUTs, where the second site loop and the first site loop have a same syntax.

33 Claims, 2 Drawing Sheets

SITE LOOPS

CLAIM TO PRIORITY

This patent application claims priority to U.S. Provisional Application No. 60/676,005, filed on Apr. 29, 2005; to U.S. Provisional Application No. 60/676,003, filed on Apr. 29, 2005; and to U.S. Provisional Application No. 60/676,737, filed on May 2, 2005. The contents of U.S. Provisional Application No. 60/676,005, U.S. Provisional Application No. 60/676,003, and U.S. Provisional Application No. 60/676,737 are hereby incorporated by reference into this application as if set forth herein in full.

TECHNICAL FIELD

This patent application relates generally to testing a device and, more particularly, to implementing site loops during testing.

BACKGROUND

Automatic test equipment (ATE) is typically an automated, usually computer-driven, system for testing devices, such as semiconductors, electronic circuits, and printed circuit board assemblies. A device being tested is referred to as a device under test (DUT).

Modern ATEs support multi-site testing. ATEs that support multi-site testing include a testing device having slots, or "sites". A device to be tested—a DUT—is inserted into each site, and the ATE performs whatever tests are necessary on the device in the site. Ideally, interactions with DUTs in the sites occur in parallel, making it possible to test numerous devices at the same time. In some cases, however, parallel processing is not, or cannot be, performed. Site loops are therefore used to interact with the DUTs serially.

Typically, two different types of site loops are used during testing. One type of site loop is used to program hardware, such as instrumentation, on the ATE. For example, hardware can be programmed to send signals to DUTs in the sites, and to receive data back from the DUTs in response to the signals. Another type of site loop is used with software. For example, this type of site loop can be used to analyze the data received from the DUTs in order to determine if the DUTs passed or failed a particular test.

Heretofore, the two different types of site loops described above constituted entirely different processes that were implemented using different computer code. This arrangement increased the complexity of the testing system without providing significant corresponding benefit.

SUMMARY

This patent application describes apparatus and methods, including computer program products, for implementing site loops during testing.

In general, in one aspect, the invention is directed to a method for use with a test system having sites that hold devices under test (DUTs). The method includes executing a first site loop to iterate through the sites, where the first site loop comprises an instruction to program hardware associated with at least one of the sites, and executing a second site loop to process data received from the DUTs, where the second site loop and the first site loop have a same syntax. This aspect may also include one or more of the following.

The first site loop and the second site loop may have at least some executable code in common. Executing the first site loop may include informing a driver associated with the hardware that a site is pending, encountering a hardware statement to program the hardware, receiving an indication from the driver in response to the hardware statement, posting the hardware statement in response to the indication, and processing the hardware statement to program the hardware at the site. Executing the first site loop may also include proceeding to a next site after processing the hardware statement, posting the next site, and processing the hardware statement to program the hardware at the next site. After the hardware statement has been processed for all of the sites, the method may also include restoring the sites to states that existed prior to executing the first site loop.

An enumerator may store states of the sites. The enumerator may store states of the sites that existed prior to executing the first loop. The states of the sites that existed prior to executing the first site loop may be obtained from the enumerator, and thereafter the method may include destroying the enumerator. Executing the second site loop may include informing hardware drivers that the sites are pending, and processing data received from the DUTs sequentially. The second site loop may be executable using instructions that are capable of encountering a hardware statement to program the hardware, receiving an indication from the driver in response to the hardware statement, and posting the hardware statement in response to the indication. The instructions may not be executed because the second site loop does not encounter the hardware statement.

In general, in another aspect, the invention is directed to a testing system that includes a testing apparatus having sites to hold DUTs, hardware to interact with the DUTs in at least some of the sites, and memory to store a driver for controlling the hardware. The system also includes a computing device having memory to store computer code, and a processing device to execute the computer code to execute a first site loop to program the hardware via the driver, receive data from the DUTs following programming, and execute a second site loop to process the data. The first site loop and the second site loop may have at least some executable code in common. The testing system may be used to perform any of the functions of the foregoing method.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
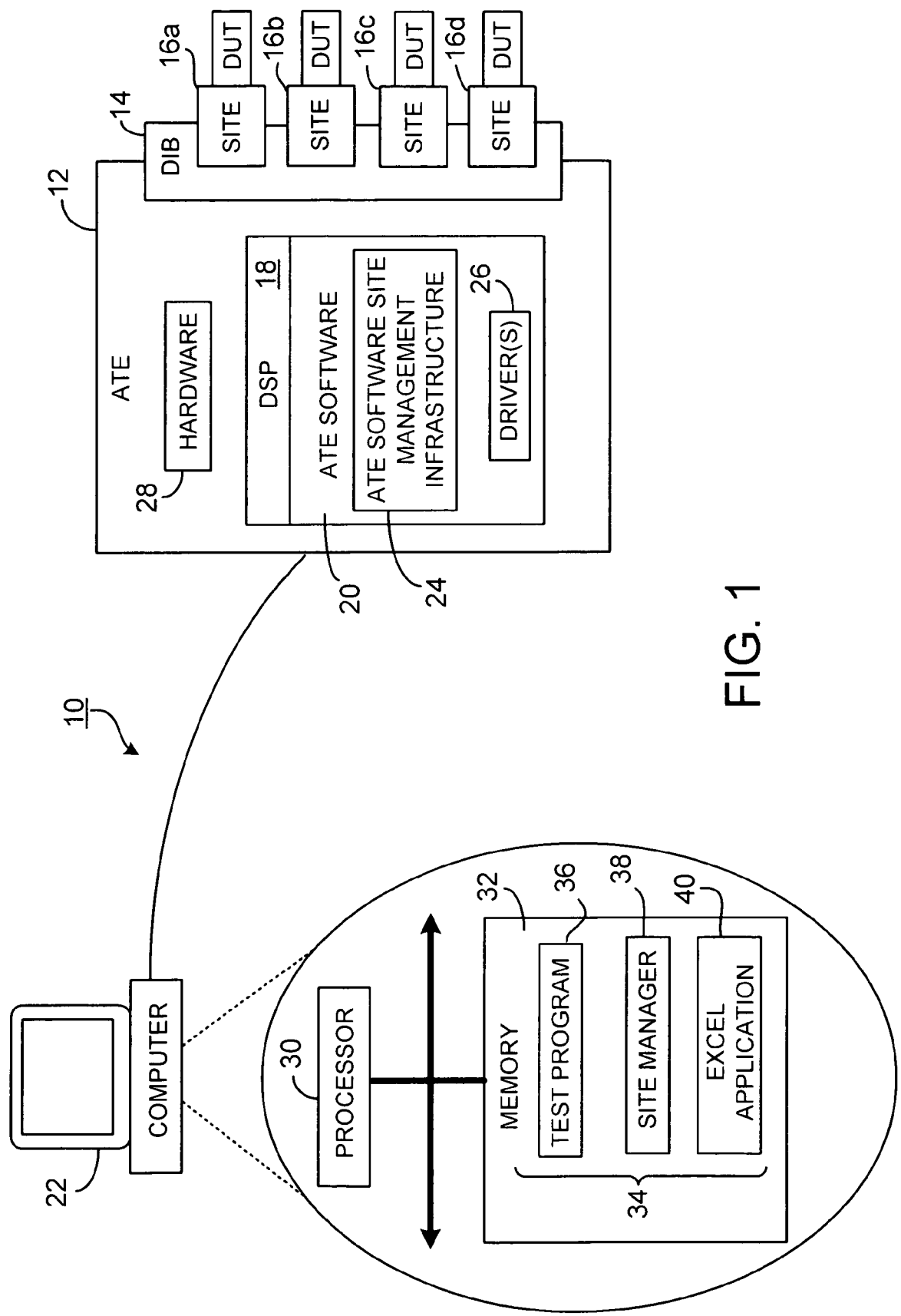
FIG. 1 is block diagram of a test system, including an ATE and a computer.

FIG. 1 shows a system 10 for use in testing multiple DUTs. System 10 includes an ATE 12. ATE 12 includes a device interface board (DIB) 14, that is used to connect devices to the ATE. DIB 14 has multiple sites 16a to 16d. A DUT may be inserted into each site for testing using the ATE. Although only four sites are shown in FIG. 1, ATE 12 may include any number of sites. Also, in the example of FIG. 1, there is one DUT per slot, however, it is not a requirement that all the sites be occupied. Each DUT may be any type of device that can be tested using an ATE, examples of which include, but are not limited to, semiconductor devices and electronic assemblies.

ATE 12 includes an internal processing device, such as digital signal processor (DSP) 18. DSP 18 may execute all or part of ATE software 20, i.e., computer program(s) comprised of executable code, to test the DUTs in sites 16*a* to 16*d*. ATE software 20 may be stored in memory (not shown) on ATE 12, or may be provided from an external processing device, such as computer 22 described below. ATE software 20 includes an ATE software site management infrastructure 24 that manages sites 16*a* to 16*d*, and one or more device drivers 26 for controlling hardware 28 on ATE 12. Hardware 28 may include analog and/or digital instrumentation for providing signals to, and receiving signals from, pins that interface to DUTs in sites 16*a* to 16*d*. Separate hardware maybe provided for each site or the same hardware may be programmed to interact with one or more sites.

ATE 12 is in communication with computer 22. Computer 22 may be any type of processing device including, but not limited to, a conventional personal computer (PC), a desktop device or a hand-held device, a multiprocessor computer, a microprocessor-based or programmable consumer electronics device, a mini-computer, a mainframe computer, and/or a personal mobile computing device. In the example of FIG. 1, computer 22 contains one or more processors, referred to simply as "processor 30", and memory 32. Memory 32 stores software 34 that is executed by processor 30 to test DUTs in ATE 12.

Software 34 includes a test program 36 for executing site loops and a site manager 38 for communicating with hardware driver(s) 26 on ATE 12. Site manager 38 is a service for managing hardware on ATE 12. In one implementation, site manager 38 is part of a specially-configured Excel® application 40 that is used to program and run ATE 12.

Site loops are implemented via code (i.e., executable instructions) that may be executed to program hardware 28 and to perform software processes, such as analyzing test results. The same code (i.e., the same site loop code) may be used both to program hardware and to perform the software processes. In one implementation, this code includes a "for each" statement and a "next" statement. The "for each" statement identifies a group of sites upon which site loops are to be executed. The "next" statement is used to iterate through those sites, i.e., to move on to a next site. For example, the group of sites may include "existing sites", meaning sites on the ATE; "starting sites", meaning all sites that are started during a test run of devices in the ATE; "active sites", meaning sites in which DUTs are currently in an unknown Pass/Fail state; or "selected sites", meaning sites that were specifically selected for a site loop either via hardware or software.

Figure 2:
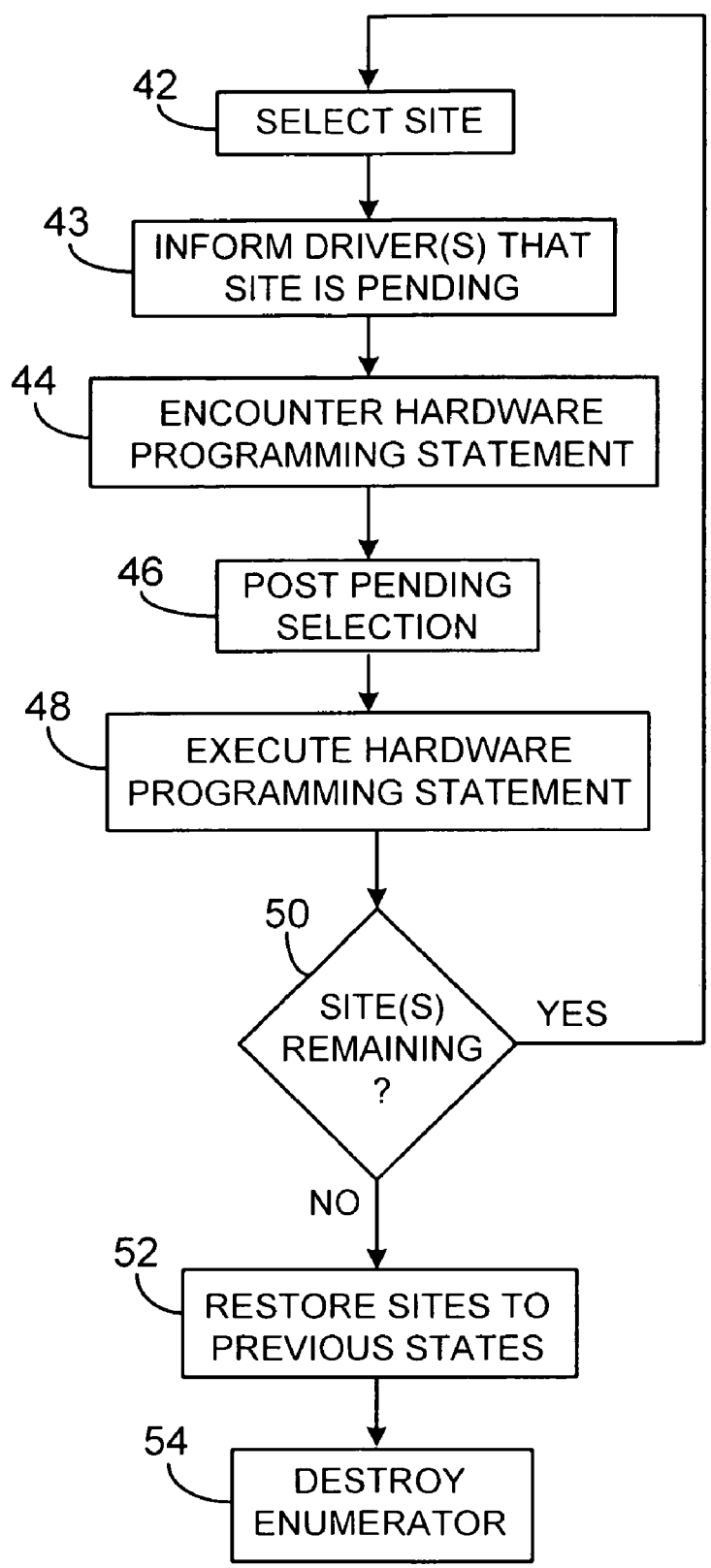
FIG. 2 is a flowchart showing actions performed during a site loop executed on the computer in the test system.

FIG. 2 is a flowchart showing operation of a site loop executed by test program 36. At execution, test program 36 creates an enumerator. In this implementation, the enumerator is an object that stores the states of the ATE's sites prior to execution of a test loop. For example, the enumerator may store hardware settings for each sites or the like. As described below, the enumerator is used to restore those states following a site loop.

As shown in FIG. 2, test program 36 selects (42) a site from among sites 16*a* to 16*d* As explained above, this may be done by going through sites included in a "for each" statement at the beginning of a site loop. For example, if a "for each" statement designates "existing sites", a first site is selected among existing sites; if the "for each" statement designates "active sites", a first site is selected among active sites; and so on.

After a site is selected (42), the selected site is designated as pending. What this means is that the site has been selected, but no action has yet been designated for the site. Site manager 38 is notified when a site is designated pending. After a site is designated pending, site manager 38 informs (43) its clients—in this case, drivers 26 for hardware 28 on ATE 12—that there is a pending site selection.

During execution, test program 36 encounters (44) a hardware programming statement. In this example, the hardware programming statement is an instruction to program hardware, such as an instrument, on ATE 12. The hardware programming statement may have the generic format of "hardware.instrument.language_statement", where "hardware" identifies the statement as a hardware programming statement; "instrument" identifies the instrument, or hardware, to be programmed"; and "language_statement" defines the action or programming to take place with respect to the instrument as a result of the hardware programming statement.

After a hardware programming statement is encountered, test program 36 notifies the appropriate instrument driver. The instrument driver checks for pending sites and determines that there is a pending site. Accordingly, the instrument driver instructs site manager 38 to post the pending site. Site manager 38 posts (46) the pending site. By posting the pending site, site manager 38 designates the pending site as the site upon which hardware programming statements are to be executed. That is, hardware programming statements are to program an instrument or other hardware associated with the posted site.

Test program 36 executes (48) the hardware programming statement to program the instrument or other hardware associated with the posted site. To execute the hardware programming statement, test program 36 either passes the hardware programming statement to the appropriate device driver and/or performs whatever actions are necessary with or without the device driver to effect programming. If test program 36 encounters other hardware programming statement(s) in the current iteration through the site loop, the hardware programming statement(s) are executed, as appropriate, for the posted site.

After the current iteration of the site loop has been completed, test program 36 de-posts the current site and determines (50) whether all selected sites have been acted upon. If all of the selected sited have not been acted upon, test program 36 selects (42) another site, and proceeds in the manner described above. If all of the selected sites have been acted upon, test program 36 obtains the prior states of the sites from the enumerator, restores the states of the sites to the prior states (52), and destroys (54) the enumerator.

During execution, the ATE obtains test data from DUTs in the sites. The test data may be obtained during the same site loop that is used to program hardware or the test data may be obtained through other operation of the ATE. The data may be, e.g., test results from the various DUTs in the sites, such as responses to stimuli provided by the ATE. Heretofore, a site loop having a separate syntax, e.g., separate format and computer code, was required to analyze the test data. However, here, the same site loop described with respect to FIG. 2 that was used to program hardware may be used to analyze the test data. That is, at least part of the computer code used to program hardware is also used to analyze test data. The operation of the site loop is as described above.

More specifically, referring to FIG. 2, test program 36 selects (42) a site, as described above, and informs (43) drivers that the site is pending. However, in this case, test program is configured to analyze test data, not to program hardware. Accordingly, a hardware programming statement is never encountered. As a result, the site is not posted and hardware does not get programmed. Instead, test program 36 performs whatever analysis (not shown) that is necessary on the test data from the selected site. Thereafter, test program 36 iterates through the sites to analyze test data from each site.

There are several advantages to using the same site loop to program hardware and to analyze test data. For example, the site loop will not "touch hardware" until the first call to any instrument driver is encountered inside the site loop. Also, users no longer need different syntax for their "software site loops," which index through site numbers, and "hardware site loops," which select sites and affect hardware.

A specific implementation of the foregoing site loop using Visual Basic is described below. In this implementation, the loop index variable (which defines the sites for the "for each" statement) is a Visual Basic variable of type Variant. The loop index variable holds the site number as a Visual Basic variable type, Long. Visual Basic uses "for each" to iterate automatically through a collection of sites in one of two ways. If the collection is an array type, Visual Basic fetches the array and iterates through the array. If the collection implements an enumeration interface (a property called _NewEnum, which returns an enumerator object), Visual Basic fetches the enumerator and iterates through it.

In operation, the "for each" statement requests an enumerator from a Sites object. The Sites object creates the enumerator and returns it to Visual Basic. The test program executes a "next" statement on the enumerator, thereby assigning a value to the loop variable. This occurs for each iteration of a site loop, whereafter the enumerator is released.

In this implementation, an enumerator is an object whose purpose is to sequence through a collection. With the site loop syntax, however, the enumerator has another function. When the enumerator object is created (when the "for each" loop is entered), a site loop is started, the presently selected sites are stored for later use, and all but the first of the previously selected sites are de-selected. The selected site changes with each "next" statement of the enumerator. When the enumerator is released, via the end of the loop or at any premature exit, the site loop is terminated and previously selected sites are restored to their previous states, excluding any sites de-activated, i.e., binned out, during the loop.

Nested loops may be handled as above. When a nested "for each" statement executes in a site loop, a newly created enumerator is initialized with a single selected site. It then iterates a single time and exits, restoring the single selected site to its previous state.

The same site loop can be used for both hardware and software site loops by delaying the hardware response to site selection until a Visual Basic statement attempts to access hardware through any call to theHdw. A change was made that does not limit the check for pending sites the thePins( ) node. If no hardware statement is executed in the loop, the hardware site selection mechanism is never invoked, as described above with respect to FIG. 2. The sequence is as follows for a site loop that contains one or more calls to hardware (e.g., hardware programming statements).

A "for each" or "next" statement modifies a currently selected set of sites to select a single site. The test program marks the current site selection as "selected." When (and if) a Visual Basic language hardware statement executes, it notes that site selection is "selected" and instructs the sites manager to update the hardware with this change. The "selected" indication is removed. The language statement then proceeds to execute. The next Visual Basic language hardware statement within the loop notes that site selection is not "selected" and proceeds directly to execution. If no hardware statement is encountered in the loop, the site selection "selected" indication is removed. The hardware is never programmed, and no hardware overhead is incurred. Processing of test results proceeds accordingly.

The site loops described herein are not limited to use with the hardware and software described above. The site loops can be implemented in digital electronic circuitry, or in computer hardware, firmware, software, or in combinations thereof.

The site loops can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the site loops can be performed by one or more programmable processors executing one or more computer programs to perform the functions of the site loops. All or part of the site loops can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. A method for use with a test system having sites that hold devices under test (DUTs), the method comprising:
    executing a first site loop to iterate through the sites, wherein the first site loop comprises an instruction to program hardware associated with at least one of the sites; and
    executing a second site loop to process data received from the DUTs, via the sites
    wherein the data received from the DUTs comprises test data, and the second site loop processes the test data as part of determining whether the DUTs pass or fail testing;

wherein the second site loop and the first site loop are executed using at least some common code; and wherein, during execution of the first site loop and the second site loop, hardware response to site selection is stayed pending encounter of a hardware programming instruction.

2. The method of claim 1, wherein executing the first site loop comprises:
informing a driver associated with the hardware that a site is pending;
encountering a hardware statement to program the hardware;
receiving an indication from the driver in response to the hardware statement;
posting the hardware statement in response to the indication; and
processing the hardware statement to program the hardware at the site.

3. The method of claim 2, wherein executing the first site loop further comprises:
proceeding to a next site after processing the hardware statement;
posting the next site; and
processing the hardware statement to program the hardware at the next site.

4. The method of claim 3, wherein, after the hardware statement has been processed for all of the sites, the method further comprises:
restoring the sites to states that existed prior to executing the first site loop.

5. The method of claim 4, wherein an enumerator stores states of the sites, the enumerator storing states of the sites that existed prior to executing the first loop; and
wherein the states of the sites that existed prior to executing the first site loop are obtained from the enumerator, and thereafter the method comprises destroying the enumerator.

6. The method of claim 2, wherein executing the second site loop comprises:
informing hardware drivers that the sites are pending; and
processing data received from the DUTs sequentially.

7. The method of claim 6, wherein the second site loop is executable using instructions that are capable of encountering a hardware statement to program the hardware, but the instructions are not executed because the second site loop does not encounter the hardware statement.

8. A method for use with a test system having sites that hold devices under test (DUTs), the method comprising:
executing a first site loop iterate through the sites, wherein the first site loop comprises an instruction to program hardware associated with at least one of the sites; and
executing a second site loop to process data received from the DUTs, wherein the second site loop and the first site loop are executed using at least some common code;
wherein the data received from the DUTs comprises test data, and the second site loop processes the test data as part of determining whether the DUTs pass or fail testing; and
wherein executing the first site loop comprises:
informing a driver associated with the hardware that a site is pending;
encountering a hardware statement to program the hardware;
receiving an indication from the driver in response to the hardware statement;
posting the hardware statement in response to the indication; and
processing the hardware statement to program the hardware at the site.

9. The method of claim 8, wherein executing the first site loop further comprises:
proceeding to a next site after processing the hardware statement;
posting the next site; and
processing the hardware statement to program the hardware at the next site.

10. The method of claim 9, wherein, after the hardware statement has been processed for all of the sites, the method further comprises:
restoring the sites to states that existed prior to executing the first site loop.

11. The method of claim 10, wherein an enumerator stores states of the sites, the enumerator storing states of the sites that existed prior to executing the first loop; and
wherein the states of the sites that existed prior to executing the first site loop are obtained from the enumerator, and thereafter the method comprises destroying the enumerator.

12. A method for use with a test system having sites that hold devices under test (DUTs), the method comprising:
executing a first site loop to iterate through the sites, wherein the first site loop comprises an instruction to program hardware associated with at least one of the sites; and
executing a second site loop to process data received from the DUTs, wherein the second site loop and the first site loop are executed are executed using at least some common code;
wherein the data received from the DUTs comprises test data, and the second site loop processes the test data as part of determining whether the DUTs pass or fail testing; and
wherein executing the second site loop comprises:
informing hardware drivers that the sites are pending; and
processing data received from the DUTs sequentially.

13. The method of claim 12, wherein the second site loop is executable using instructions that are capable of encountering a hardware statement to program the hardware, receiving an indication from a driver in response to the hardware statement, and posting the hardware statement in response to the indication, but the instructions are not executed because the second site loop does not encounter the hardware statement.

14. A testing system comprising:
a testing apparatus comprising:
sites to hold devices under test (DUTs);
hardware to interact with the DUTs in at least some of the sites; and
memory to store a driver for controlling the hardware; and
a computing device comprising:
memory to store computer code; and
a processing device to execute the computer code to:
execute a first site loop to program the hardware via the driver;
receive data from the DUTs via the sites following programming; and
execute a second site loop to process the data;
wherein the first site loop and the second site loop have at least some executable code in common; and wherein, during execution of the first site loop and the second site loop, hardware response to site selection is stayed pending encounter of a hardware programming instruction.

15. A testing system comprising:
a testing apparatus comprising:
sites to hold devices under test (DUTs);
hardware to interact with the DUTs in at least some of the sites; and
memory to store a driver for controlling the hardware; and
a computing device comprising:
memory to store computer code; and
a processing device to execute the computer code to:
execute a first site loop to program the hardware via the driver;
receive data from the DUTs following programming; and
execute a second site loop to process the data;
wherein the first site loop and the second site loop have at least some executable code in common; and
wherein executing the first site loop comprises:
informing the driver that a site is pending;
encountering a hardware statement to program the hardware;
receiving an indication from the driver in response to the hardware statement;
posting the hardware statement in response to the indication; and
processing the hardware statement to program hardware associated with the site.

16. The testing system of claim 15, wherein executing the first site loop further comprises:
proceeding to a next site after processing the hardware statement;
posting the next site; and
processing the hardware statement to program hardware associated with a next site.

17. The testing system of claim 16, wherein, after the hardware statement has been processed for all of the sites, the processing device executes computer code to:
restore the sites to states of the sites that existed prior to executing the first site loop.

18. A machine-readable medium to store executable instructions for use with a test system having sites that hold devices under test (DUTs), the instructions to cause one or more machines to:
execute a first site loop to iterate through the site, wherein the first site loop comprises an instruction to program hardware associated with at least one of the sites; and
execute a second site loop to process data from the DUTs via the sites;
wherein the data received from the DUTs comprises test data, and the second site loop processes the test data as part of determining whether the DUTs pass or fail testing;
wherein the second site loop and the first site loop are executed using at least some common code; and
wherein, during execution of the first site loop and the second site loop, hardware response to site selection is stayed pending encounter of a hardware programming instruction.

19. The machine-readable medium of claim 18, wherein executing the first site loop comprises:
informing a driver associated with the hardware that a site is pending;
encountering a hardware statement to program the hardware;
receiving an indication from the driver in response to the hardware statement;
posting the hardware statement in response to the indication; and
processing the hardware statement to program the hardware at the site.

20. The machine-readable medium of claim 19, wherein executing the first site loop further comprises:
proceeding to a next site after processing the hardware statement;
posting the next site; and
processing the hardware statement to program the hardware at the next site.

21. The machine-readable medium of claim 20, wherein the machine readable medium further comprises instructions to restore the sites to states that existed prior to executing the first site loop after the hardware statement has been processed for all of the sites.

22. The machine-readable medium of claim 21, wherein an enumerator stores states of the sites, the enumerator storing states of the sites that existed prior to executing the first loop; and
wherein the states of the sites that existed prior to executing the first site loop are obtained from the enumerator, and thereafter the enumerator is destroyed.

23. the machine-readable medium of claim 18, wherein executing the second site loop comprises:
informing hardware drivers that the sites are pending; and
processing data received from the DUTs sequentially.

24. A machine-readable medium to store executable instructions for use with a test system having sites that hold devices under test (DUTs), the instructions to cause one or more machines to:
execute a first site loop to iterate through the sites, wherein the first loop comprises an instruction to program hardware associated with at least one of the sites; and
execute a second site loop to process data received from the DUTs;
wherein the second site loop and the first site loop are executed using at least some common code;
wherein the data received from the DUTs comprises test data, and the second site loop processes the test data as part of determining whether the DUTs pass or fail testing; and
wherein executing the first site loop comprises:
informing a driver associated with the hardware that a site is pending;
encountering a hardware statement to program the hardware;
receiving an indication from the driver in response to the hardware statement;
posting the hardware statement in response to the indication; and
processing the hardware statement to program hardware associated with the site.

25. the machine-readable medium of claim 24, wherein executing the first site loop further comprises:
proceeding to a next site after processing the hardware statement;
posting the next site; and
processing the hardware statement to program the hardware associated with a next site.

26. The machine-readable medium of claim 25, wherein the machine-readable medium further comprises instructions to cause the one or more machines to:
    restore the sites to states that existed prior to executing the first site loop after the hardware statement has been processed for all the sites.

27. The machine-readable medium of claim 26, wherein an enumerator stores states of the sites, the enumerator storing states of the sites that existed prior to executing the first loop; and
    wherein the states of the sites that existed prior to executing the first site loop are obtained from the enumerator.

28. A machine-readable medium to store executable instructions for use with a test system having sites that hold devices under test (DUTs), the instructions to cause one or more machines to:
    execute a first site loop to iterate through the sites, wherein the first site loop comprises an instruction to program hardware associated with at least one of the sites; and
    execute a second site loop process data received from the DUTs;
    wherein the second site loop and the first site loop are executed using at least some common code;
    wherein the data received from the DUTs comprises test data, and the second site loop processes the test data as part of determining whether the DUTs pass or fail testing; and
    wherein executing the second site loop comprises:
        informing hardware drivers that the sites are pending; and
        processing data received from the DUTs sequentially.

29. The machine-readable medium of claim 28, wherein the second site loop is executable using code that is capable of encountering a hardware statement to program the hardware, but the code is not executed because the second site loop does not encounter the hardware statement.

30. The machine-readable medium of claim 23, wherein the second site loop is executable using instructions that are capable of encountering a hardware statement to program the hardware, but the instructions are not executed because the second site loop does not encounter the hardware statement.

31. the testing system of claim 14, wherein executing the first site loop comprises:
    informing the driver that a site is pending;
    encountering a hardware statement to program the hardware;
    receiving an indication from the driver in response to the hardware statement;
    posting the hardware statement in response to the indication; and
    processing the hardware statement to program hardware associated with the site.

32. The testing system of claim 31, wherein executing the first site loop further comprises:
    proceeding to a next site after processing the hardware statement;
    posting the next site; and
    processing the hardware statement to program hardware associated with a next site.

33. The testing system of claim 32, wherein, after the hardware statement has been processed for all of the sites, the processing device executes computer code to:
    restore the sites to states of the sites that existed prior to executing the first site loop.

* * * * *

UNITED STATES PATENT AND TRADEMARK OFFICE
CERTIFICATE OF CORRECTION

| | | |
|---|---|---|
| PATENT NO. | : 7,254,508 B2 | Page 1 of 1 |
| APPLICATION NO. | : 11/231722 | |
| DATED | : August 7, 2007 | |
| INVENTOR(S) | : Stephen J. Hlotyak | |

It is certified that error appears in the above-identified patent and that said Letters Patent is hereby corrected as shown below:

Column 8, Claim 12, Line 31;
Delete "are executed" before "using"

Signed and Sealed this

Thirteenth Day of November, 2007

JON W. DUDAS
*Director of the United States Patent and Trademark Office*